United States Patent [19]

Bahraman

[11] Patent Number: 5,225,696
[45] Date of Patent: Jul. 6, 1993

[54] FOCAL PLANE ARRAY WITH CHARGE TRANSFER GATE

[75] Inventor: Ali Bahraman, Palos Verdes Estates, Calif.

[73] Assignee: Northrop Corporation, Hawthorne, Calif.

[21] Appl. No.: 827,241

[22] Filed: Jan. 29, 1992

[51] Int. Cl.⁵ .................................... H01L 27/14
[52] U.S. Cl. .................................. 257/291; 257/292; 257/448; 257/290; 250/208.1
[58] Field of Search ............... 257/290, 291, 292, 443, 257/448; 250/208.1, 208.2, 208.3; 307/311

[56] References Cited

U.S. PATENT DOCUMENTS

| | | | |
|---|---|---|---|
| 3,969,751 | 7/1976 | Drukaroff et al. | 357/30 |
| 4,028,719 | 6/1977 | Curtis | 357/30 |
| 4,495,409 | 1/1985 | Baji et al. | 250/208.1 X |
| 4,584,608 | 4/1986 | Soneda et al. | 257/292 X |
| 4,679,212 | 7/1987 | Hynecek | 377/58 |
| 4,873,561 | 10/1989 | Wen | 357/24 |
| 4,957,659 | 9/1990 | Arques | 250/208.1 |
| 4,985,619 | 1/1991 | Arques | 250/208.1 |
| 5,122,649 | 6/1992 | Murayama et al. | 257/291 X |
| 5,153,423 | 10/1992 | Conrads et al. | 250/208.1 |

Primary Examiner—William Mintel
Attorney, Agent, or Firm—Terry J. Anderson; Robert B. Block; Karl J. Hoch, Jr.

[57] ABSTRACT

A radiation detection system includes an array of radiation detectors disposed on a common substrate of type-n silicon, wherein each detector includes an electrode spaced apart from the silicon by silicon dioxide. Two rows of the detectors are coupled by two rows of transfer gates to a common row of diodes for reading out data from any one or ones of the detectors which are individually addressable by row and column conductors. The transfer gate electrodes of contiguous pixels are connected together to form a row conductor. The gates are electrically activatable to provide electrical connection for receiving data of a detector only during a readout interval, and provide electrical insulation of the detectors at all other times. This inhibits blooming. Detector windows may be fabricated of thinned chrome or aluminum layers, or of polysilicon arranged to provide free spaces through which ultraviolet radiation can propagate into the detector. This allows dual-mode operation for reception of both optical and ultraviolet radiation.

12 Claims, 4 Drawing Sheets

FOCAL PLANE ARRAY WITH CHARGE TRANSFER GATE

BACKGROUND OF THE INVENTION

This invention relates to arrays of detectors of incident radiation for obtaining imaging data of a radiant subject and, more particularly, to a focal plane array of photodetectors employing rows of readout diodes and charge transfer gates constructed upon a common substrate with the readout diodes and the gates, wherein the diodes are coupled via the charge transfer gates to the photodetectors, this providing improved resistance to damage from high energy radiation including blasts of gamma radiation.

Imaging systems for obtaining image data of subjects by viewing radiation in the ultraviolet and/or visible range of the electromagnetic spectrum may employ an array of radiation detectors permitting electronic readout of imaging data. By way of example, such systems may be employed in outer space for viewing stars for celestial navigation, as well as for tracking moving vehicles. Such an imaging system may include a lens for focusing incident radiation upon a focal plane array of detectors for detecting pixels of the image. Each detector produces an electric signal, such as an electric charge, in response to illumination by the radiation. The detector array is provided with electrical paths for conducting signals from the detectors to an image processor which converts the detector signals into an image suitable for viewing by a person or for operation of automated electronic navigation and/or tracking equipment.

One form of detector array in present use employs charge-coupled devices (CCD's) arranged in rows and columns. Electric circuitry for use with CCD's is well known, and provides for a construction of the array wherein charges produced at the sites of the pixels in each row of CCD's are clocked to the end of the row to provide a sequence of pixel signal providing data of a row of the image. The pixel signals from the various CCD rows of the array are multiplexed for communication to image-processing equipment to obtain the imaging data. Addressing of the various pixels is obtained by timing circuitry which provides for a sampling of each pixel signal at a designated sample time which serves to identify the location of each pixel in the detector array.

A problem arises in a situation wherein the detector array may be subjected to intense fields of nuclear radiation, particularly high-energy x-rays or gamma radiation. Degradation in the performance of the CCD detector array from exposure to the radiation is manifested in a degradation in charge-transfer efficiency, the generation of increased dark current, and the possible development of shorted and/or disconnected elements of the detector array. Electronic devices which have substantial immunity to high intensity radiation are said to possess radiation hardness. The foregoing areas of sensitivity of CCD detector arrays to radiation fields limits the application of conventional CCD detector arrays in the case of hardened systems.

A particularly disadvantageous feature of a CCD array, from the point of view of radiation hardness, is the serial transfer of charge along a row of pixels from one pixel to the next. A breakdown in one of the charge transfer elements from intense gamma radiation may disable a major portion or possibly an entire row of the detector array. Another form of construction of the foregoing array employs CID's (charge injection devices) wherein each column electrode is connected to all pixel detectors along a column of detectors. This form of construction avoids the disadvantage of the CCD wherein the charges in a row of detectors must propagate through numerous charge transfers before being extracted from the array. However, in the CID array, the connection of numerous detectors of the column to a single output column electrode introduces a significant increase in the output capacitance of the array. The increased capacitance limits the array size in the column direction so as to avoid excessive capacitance. It is noted that, in the rapid readout of successive signals from the detectors of an array, the amplitudes of the signals decrease with increasing capacitance, hence there is need for reduction of the column length in a CID array. Furthermore, CID arrays are susceptible to negative blooming and loss of contrast due to charge integration in all pixels of a column upon a reading of the signal of a single pixel. Integrated charge in other pixels is generated by incident high-energy photons, ionizing radiation, or by dark current resulting from the radiation-produced degradation of minority-carrier lifetime. Thus, neither the CCD or the CID form of construction of detector array is adequately suited for a radiation-hardened imaging system, employing a large detector array.

SUMMARY OF THE INVENTION

The aforementioned problems are overcome and other advantages are provided by a radiation detection system having an array of radiation detectors constructed on a common substrate, the detectors being arranged in rows and columns along with rows of readout diodes and rows of charge-transfer gates, all of which are constructed on the common substrate. Each of the detectors is constructed in the form of a charge extraction device (CED), similar to that disclosed in Curtis, U.S. Pat. No. 4,028,719. Each of the detectors produces an electric charge in response to illumination by radiation in the visible and/or ultraviolet portion of the electromagnetic spectrum. Each detector is a metal-oxide semiconductor (MOS) photodetector. Alternatively, each detector may be a p-n diode photodetector. In accordance with a feature of the invention, each detector of a row of detectors is coupled individually by a charge transfer gate to one of the readout diodes for transferring signal charge from the detector to the readout diode, there being one transfer gate assigned to each detector for this function. If desired, a readout diode may serve the purpose of reading out pixel signals from more than one of the detectors for reduction of output capacitance and the number of components of the array. Reduction in the number of components serves to increase the available area of detector surface for receiving incident radiation. The detectors, gates, and the diodes are arranged in rows and columns. Electrical column conductors connect diodes of each column to an electronic controller, and electrical connection is made also between each of the rows of the gates to the electronic controller to enable the electronic controller to address individual ones of the detectors for which data is to be read. Included within the electronic controller is circuitry connected to each of the column conductors for sampling and filtering the detector signals to prepare the detector signals for providing an image of the subject. The detectors may be addressed in random fashion to provide for subframing of the data fields so as to enable a higher data sampling rate for a small region of interest in the subject.

The construction of the detector array, in accordance with the invention, provides for reduced capacitance of the output column conductors because the column conductors are not connected or tied to any of the detectors. Also, there is electrical isolation between the detectors which inhibits optical and electronic blooming. In the preferred embodiment of the invention, wherein two rows of detectors shares a single row of diodes, there is a further reduction in capacitance because the number of diodes connected to each column conductor is reduced by a factor of two. Each detector includes a window through which incident radiation is viewed. The window may be formed of a thin layer of metal such as chrome or aluminum bordered by thicker aluminum boundaries, a thin central region of each chrome or aluminum layer being essentially transparent to the propagation of visible and ultraviolet radiation while the thicker boundary regions provide adequate electrical conductivity to establish an electric field through the detector between the thin metal window and the substrate. Alternatively, fingers of a relatively thin layer of polysilicon electrodes are employed in the window area to cover only approximately 50% of the photodetector area. The finger arrangement of the polysilicon is adequate to provide the electric field while allowing sufficient space for propagation of ultraviolet radiation between the fingers to the detector. The visible radiation is able to propagate both between the fingers and through the fingers so that there is a significant reduction in propagation efficiency by use of the polysilicon finger electrodes only in the case of the ultraviolet radiation wherein the reduction of efficiency is by a factor of one-half. With either construction of the window, namely, the metal or the polysilicon, the detector is able to respond to both the visible and the ultraviolet regions of the spectrum.

BRIEF DESCRIPTION OF THE DRAWING

The aforementioned aspects and other features of the invention are explained in the following description, taken in connection with the accompanying drawing wherein.

DETAILED DESCRIPTION

Figure 1:
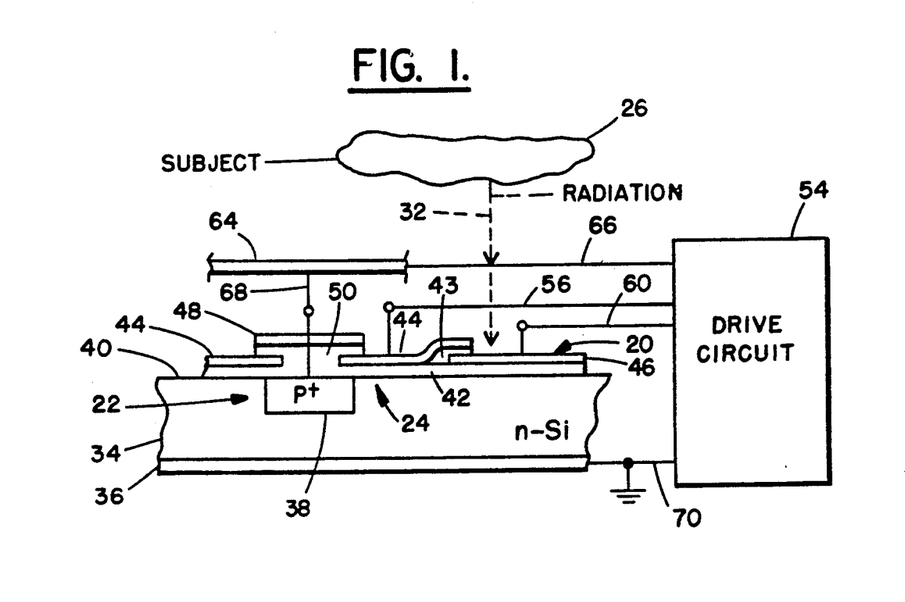
FIG. 1 shows, diagrammatically, a side elevation view of a detector with its gate and its diode for one pixel of an array of radiation detectors.
Figure 2:
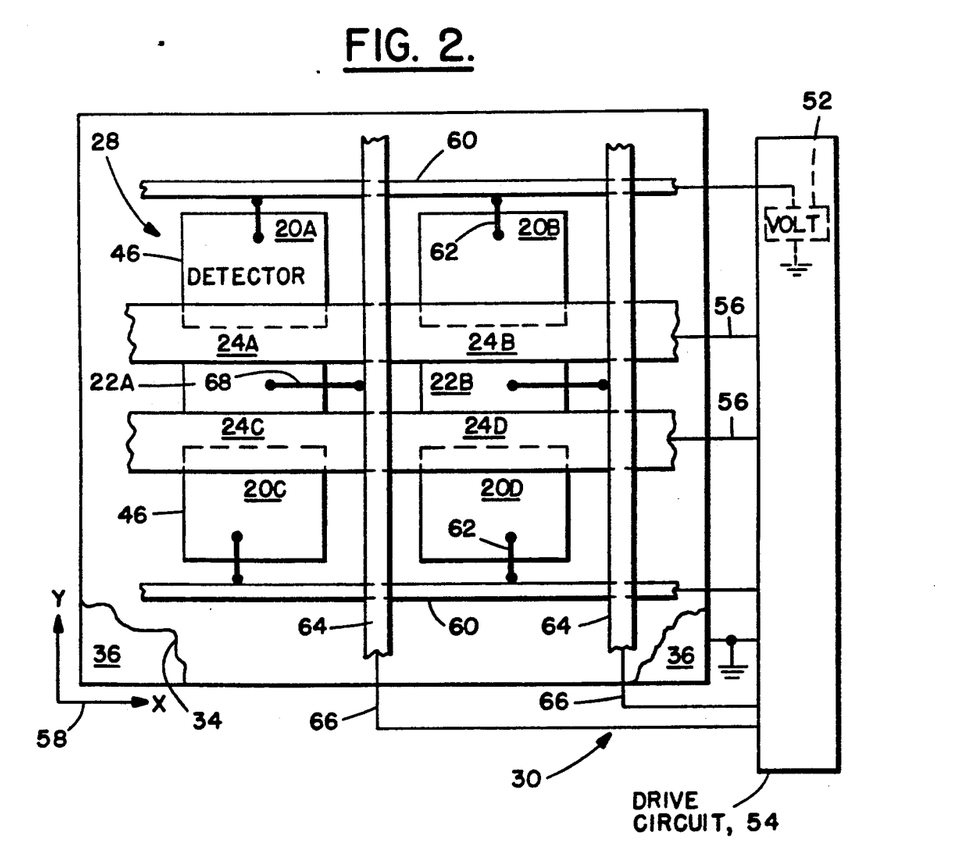
FIG. 2 shows, diagrammatically, a plan view of an array of four radiation detectors with their gates and their diodes.

With reference to FIGS. 1 and 2, FIG. 1 shows details in the construction of a radiation detector 20 with a readout diode 22 and a transfer gate 24 for obtaining one pixel of image data of a subject 26 in accordance with the invention. In FIG. 2, a plurality of detectors, gates and diodes, as constructed in FIG. 1, are arranged in an array 28 of a detector system 30 for viewing the subject 26, the array 28 of FIG. 2 having four detectors 20A-D, four gates 24A-D and two diodes 22A-B. Radiation, indicated by an arrow 32, is in the portion of the electromagnetic spectrum including visible and ultraviolet radiation, and propagates from the subject 26 to the detector 20 in FIG. 1, and to each of the detectors 20A-D of FIG. 2. In FIG. 1, the detector 20 and the diode 22 and the gate 24 are constructed upon a common substrate 34 of type-n silicon with a metallization layer 36 disposed along a back surface of the substrate 34. The diode 22 comprises a heavily-doped type-p region 38 formed along a front surface 40 of the substrate 34. The gate 24 and the detector 20 are insulated from one another by an insulating layer 43 of silicon dioxide. The gate 24 and the detector 20 further comprise electrically-conductive layer electrodes 44 and 46, respectively, disposed on top of the insulating layer 42. A radiation shield 48 (FIG. 1) in the form of a metallic layer is supported in front of the diode 22 by an insulating layer 50 of silicon dioxide. The shield 48 has been deleted in FIG. 2 to simplify the drawing. The electrode 44 of the gate 24 is formed of polysilicon. The electrode 46 of the detector 20 may be formed of metal or polysilicon as will be described in further detail hereinafter.

The detector 20 is provided with a bias voltage, as taught in the aforementioned Curtis patent, or a pulse voltage, the bias or pulse voltage being applied between the electrode 46 and the layer 36 by means of a suitable voltage source 52 of a drive circuit 54. Since, in the detector 20, the electrode 46 is electrically conductive and the substrate 34 is a semiconductor with the insulating layer 42 therebetween, the detector 20 may be viewed as a MOS capacitor. During operation, the detector 20 is biased to generate a depletion layer (potential well) in the silicon region directly beneath electrode 46 of the MOS capacitor. In response to the incident radiation which permeates the electrode 46 and the layer 42, the detector 20 develops electric charges beneath the insulating layer 42 within the substrate 34. These charges are retained in the potential well of the detector 20 by virtue of the electric field produced by the bias or pulse voltage applied between the electrode 46 and the layer 36 during a charge integration interval prior to activation of the gate 24.

Activation of the gate 24 of FIG. 1, and of the gates 24A-D of FIG. 2 is accomplished by application of address signals by the drive circuit 54 to the electrode 44 in each of the detectors 24A-24D. In the construction of the array 28 of FIG. 2, it is convenient to construct the gates 24A and 24B contiguous each other in the form of a single strip of polysilicon so that one address line 56 from the drive circuit 54 is sufficient to energize both the gates 24A-B. A similar construction is provided for the gates 24C and 24D, both of these gates being fabricated of a single strip of polysilicon, so that a further address line 56 of the drive circuit 54 can energize simultaneously both the gates 24C-D. A coordinate axes reference 58 shows X and Y directions for the array 28. Thus, the address lines 56 are row or X address lines.

Row conductors 60 connect with the drive circuit 54 for applying voltage from the voltage source 52 to the electrodes 46 of the respective detectors 20A-D, connection between the row conductors 60 and the electrodes 46 being indicated schematically via lines 62. Column conductors 64 connect via column, or Y, address lines 66 to the drive circuits 54 for applying an address signal to the diodes 22A-B. Connection of the column conductors 64 with the diodes 22A-B is indicated schematically via lines 68. A fragmentary portion of a column conductor 64 is shown also in FIG. 1, along with a column address line 66 and a row address line 56. The layer 36 on the back side of the substrate 34 connects with the drive circuit 54 via a connection which is grounded at 70. Voltages of the address signals are applied between the address lines 56 and ground 70, and between the address lines 66 and ground 70.

A transfer gate 24 operates with its detector 20 and its readout diode 22 as follows. Upon a pulsing of the gate 24, a potential well forms under the gate. If the diode 22 also has a sufficiently large reverse bias, then charges integrated in the potential well of the detector 20 flow to the potential well of the gate 24, and then on to the diode 22. Since there are many of the diodes 22 which are connected in parallel and are reversed biased, a large charge capacity exists in the parallel connection of the diodes 22, and all of the charge from detector 20 can flow to the reverse-biased diodes.

The shield 48 protects the diode 22 from the radiation 32 so as to prevent the development of additional electric charges within the doped region 38 during illumination of the array 28 with the radiation from the subject 26. In the construction of the array 28, the row conductors 60 and the column conductors 64 may be formed of a metal, such as aluminum, or other electrically conductive material such as polysilicon, and are insulated from each other in accordance with well-known constructional methods of photodetector arrays. Similarly, signals carried by the column conductors 64 are insulated from signals within the gates 24A-B and 24C-D in accordance with well-known constructional methods of photodetector arrays.

Figure 3:
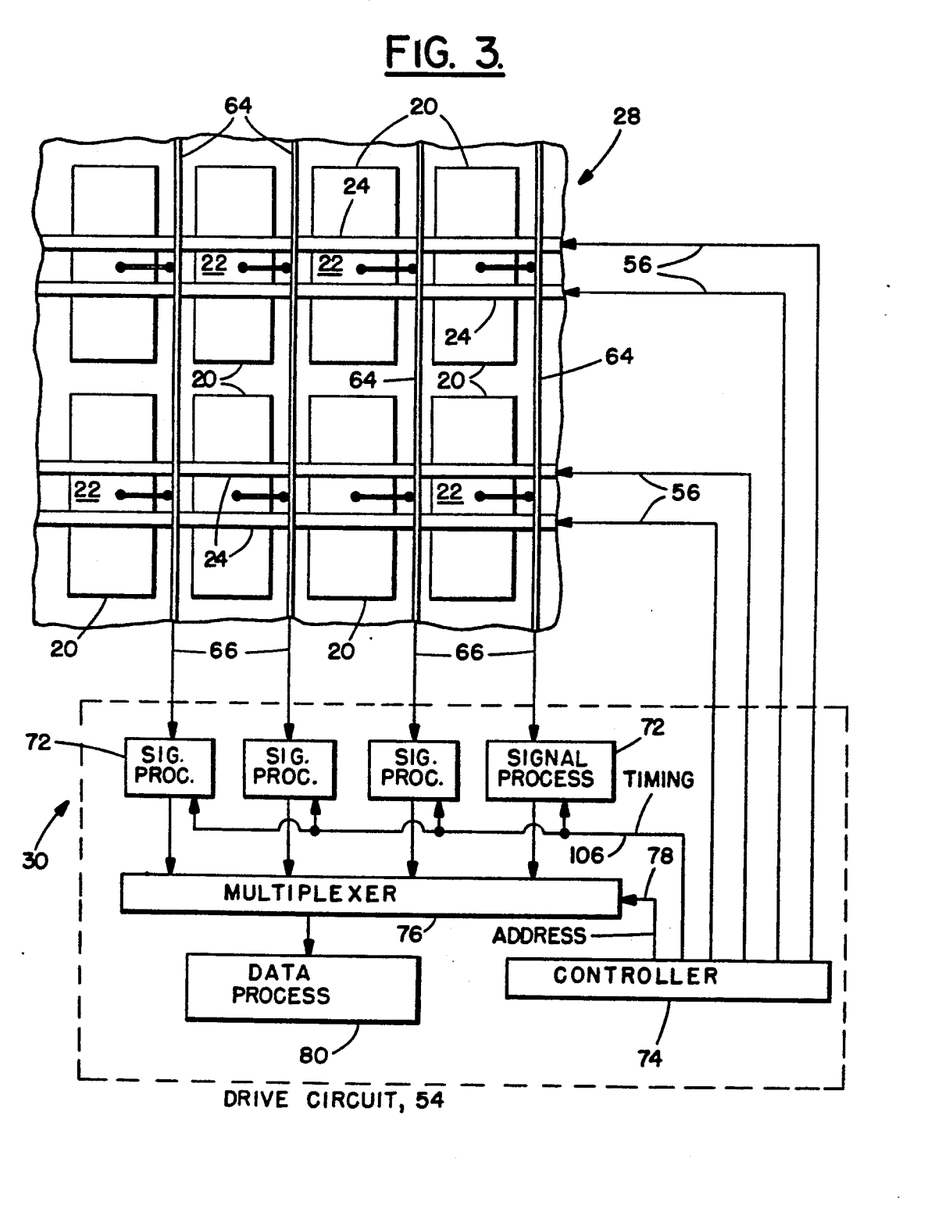
FIG. 3 shows, diagrammatically, a portion of an array having multiple radiation detectors arranged in rows and columns, the figure including circuitry for the addressing of rows and columns to extract image data of a subject viewed by the array.

FIG. 3 shows further detectors 20 of the array 28 of FIG. 2, FIG. 3 showing the paired arrangement of detectors 20 with a readout diode 22. Each of the detectors 20 is provided with a transfer gate 24 which provides for transferring data from the detector 20 to the readout diode 22. Initiation of the integration interval wherein each detector 20 builds up charge in response to illumination by the radiation, and initiation of the readout process for extracting data signals representative of the stored charge, are controlled by activation and deactivation of the address lines 56 and 66.

Also shown in FIG. 3 are details in the construction of the drive circuit 54. The drive circuit 54 comprises a plurality of signal processors 72 connected to respective ones of the column address lines 66. The column address lines 66 serve the dual functions of addressing the diodes 22 of the respective columns, as well as serving as conduits for signals read out from the detectors 20 via the diodes 22. A controller 74 within the drive circuits 54 provides the address signals for the row-address lines 56 and includes well-known circuitry (not shown) for generating such address signals. The controller 74 also generates timing signals for operating the signal processors 72 concurrently with the generation of the address signals. Output signals of the signal processors 72 are selected by a multiplexer 76 in accordance with column address signals provided via address lines 78 from the controller 74. In the operation of the signal processor 72, data is read out of all of the columns. However, only data from those columns addressed via the column addresses on lines 78 are extracted by the multiplexer 76 for application to a data processor 80. The data processor 80, by way of example, may comprise conventional circuitry for storing image data of the subject 26, as well as a display (not shown) for providing a person with a visual image of the subject 26. The row conductors 60 (FIG. 2) which provide the bias or pulse voltage to the detectors 20, and the shield 48 (FIG. 1) for each of the readout diodes 22 are not shown in FIG. 3 in order to clarify the presentation of the arrangement of the detectors 20 in rows and columns, and the presentation of the charge transfer means between two rows of detectors 20 to a single row of diodes 22 via a pair of rows of gates 24 disposed on opposite sides of the row of diodes.

Figure 4:
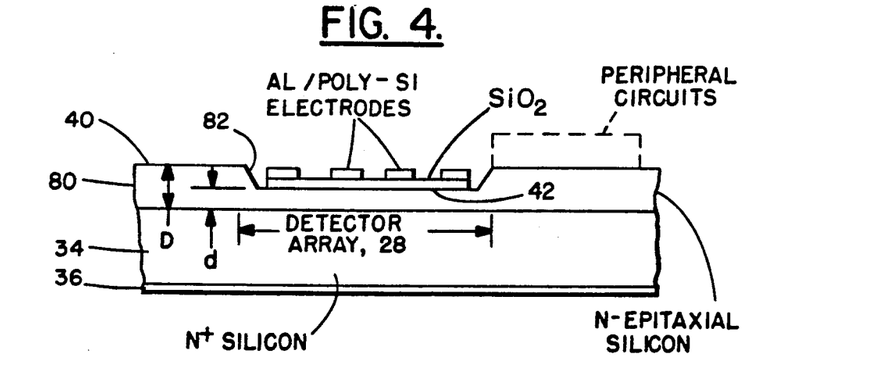
FIG. 4 shows, diagrammatically, an elevation view of a portion of an array having a plurality of detectors, the figure indicating a thinned portion of an epitaxial layer at the site of the array.

FIG. 4 shows a further constructional feature which is advantageously incorporate into the construction of the detector array 28 of FIGS. 1-3. The substrate 34 is provided at its front surface 40 with an epitaxial layer 80 of type-n silicon which may be thinned from its nominal depth D to a reduced depth d at the locus of the elements of the array 28. At the interface between the nominal depth and the reduced depth, there is a slope 82 having an inclination of approximately 60 degrees measured from the horizontal. The thinning of the epitaxial layer 80 serves to reduce photocurrents produced by a surge of gamma or x-ray radiation, and also to reduce dark current generation due to neutron irradiation of the array 28. Thus, this feature serves to harden the detector system 30 to intense radiation. The region of the epitaxial layer 80 of nominal thickness surrounding the array 28 is suitable for fabricating peripheral circuits, such as components of the drive circuit 54, used in control of the array 28.

Furthermore, for hardening the array 28, the transfer gate 24 is provided with a short channel length, on the order of 1.25 to 2 microns. The use of the type-p well, as in a diode region 38, in a type-n substrate militates against breakdown of isolation between adjacent pixels in the presence of intense radiation. This form of construction also minimizes radiation induced photocurrents. Also, frequency-dependent noise associated with the oxide-silicon interface is significantly smaller with the present form of construction employing the type-n silicon substrate than would be the case for a type-p substrate.

Figure 5:
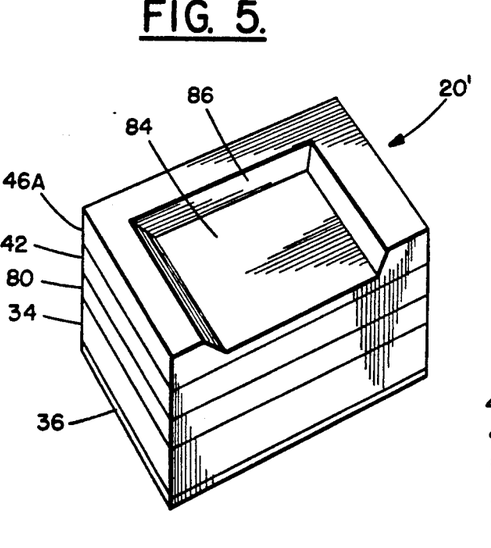
FIG. 5 shows, in stylized form, a perspective view of a portion of a single detector including an aluminum window which is thinned in a central portion thereof.
Figure 6:
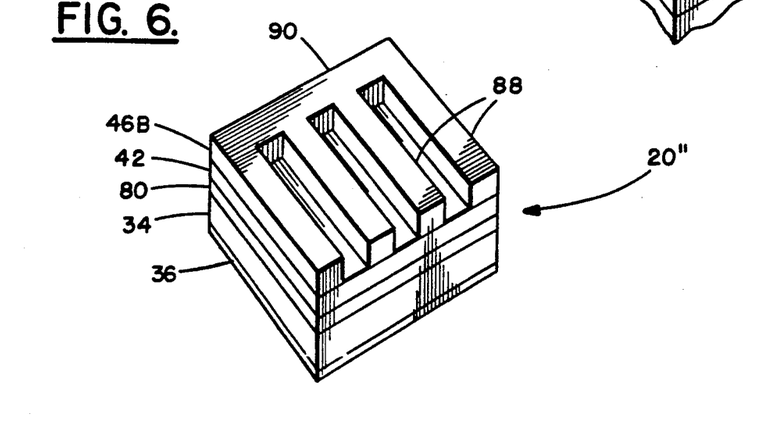
FIG. 6 shows, in stylized form, a perspective view of a photodetector comprising a polysilicon electrode structure having the form of a set of fingers.

With reference to FIGS. 1, 5, and 6, the detector 20 with its electrode 46 (FIG. 1) may be constructed in the embodiment of the detector 20' with a metal electrode 46A in FIG. 5, or in the embodiment of detector 20" with a polysilicon electrode 46B in FIG. 6. In FIG. 5, the electrode 46A has a reduced thickness in a central portion 84 and a nominal thickness in a border 86. The border 86 may encircle the central portion 84, as illustrated in FIG. 5, or may consist of a single strip at either the top or the bottom of the central portion 84. The central portion 84 is sufficiently thin to allow propagation of both visible and ultraviolet radiation into the detector 20,. The border 86 is sufficiently thick to provide electrical conductivity between a row conductor 60 (FIG. 2) and the central portion 84 to establish the requisite electric field throughout the detector 20' between the electrode 46A and the substrate 34. In the embodiment of FIG. 6, portions of the electrode 46B have been deleted to produce the configuration of a set of fingers 88 extending from a common spine 90. The thickness of the fingers 88 and of the spine 90 is sufficient to provide adequate electrical conductivity. Visible radiation is able to propagate through the fingers 88; however, ultraviolet radiation is severely attenuated by the thickness of the polysilicon fingers 88. Both the visible and the ultraviolet radiation propagate within the spaces between the fingers 88 so as to enter the detector 20'. Thus, both the detectors 20' and 20" are capable of receiving visible and ultraviolet radiation. However, in the embodiment of FIG. 6, the efficiency of the detector 20" for the reception of ultraviolet radiation is approximately one-half the efficiency of reception of the visible radiation. In the detector 20', the central portion 84 which may be regarded as a semi-transparent metal film, has a thickness of approximately 50-75 angstroms while the border 86 has a thickness of approximately 5000 angstroms and a width of approximately 1.25 microns.

Figure 6A:
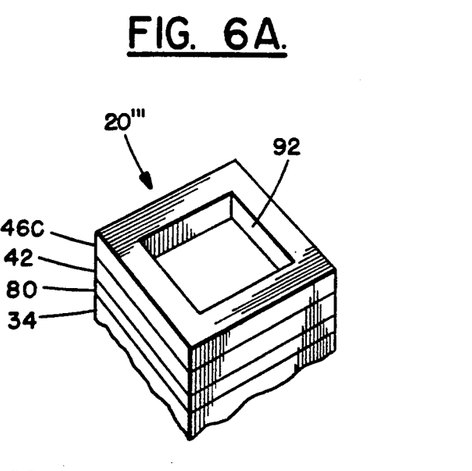
FIG. 6A is a fragmentary view of an alternative embodiment of a detector assembly of FIG. 6.

In FIG. 6A, there is shown a detector 20''' which employs an electrode 46C fabricated of polysilicon, the electrode 46C being disposed in the manner of the frame which encircles a border of the front surface of the detector 20'''. A central region 92 of the electrode 46C is free of polysilicon so as to expose the insulating silicon-dioxide layer 42 directly to both visible and ultraviolet radiation. The border of the front viewing surface of the detector 20''' which is covered by the polysilicon of the electrode 46C is exposed, essentially, to only the visible radiation because the polysilicon attenuates the ultraviolet radiation. The area of the exposed central region 92 is equal approximately to the area covered by the polysilicon so that the detector 20''' like the detector 20" of FIG. 6, is capable of receiving both visible and ultraviolet radiation. However, the efficiency of reception of the ultraviolet radiation is only approximately one-half the efficiency of reception of the visible radiation. In the embodiment of FIG. 6A, a depletion layer of the detector 20''' extends laterally into the optical window, and holes generated at the silicon surface in the optical window drift and diffuse laterally into the electrode-46 MOS potential well wherein the holes are collected and the charge is integrated.

Figure 7:
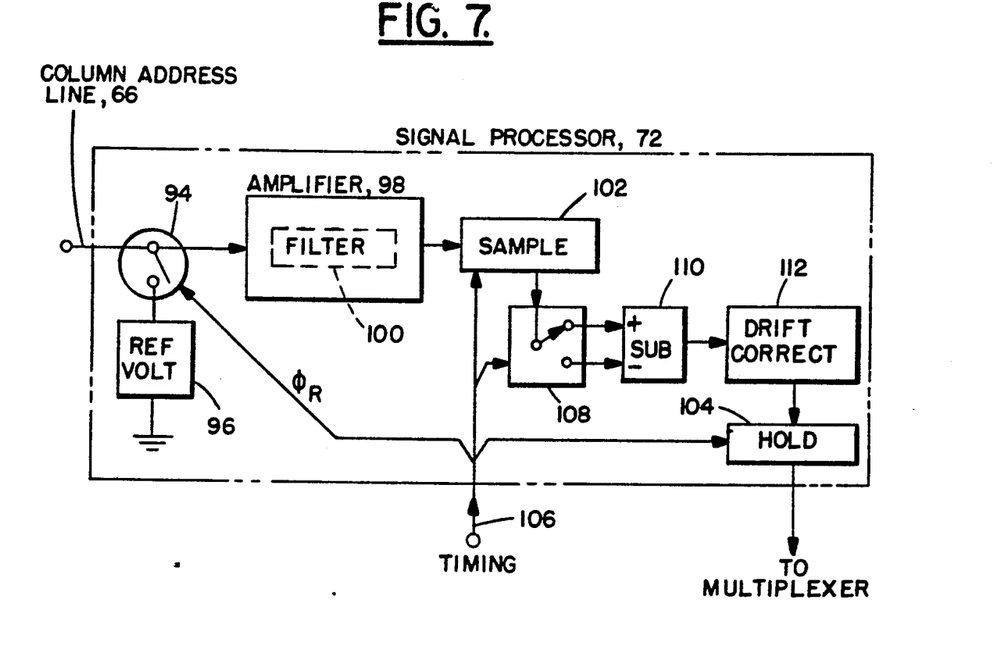
FIG. 7 is a block diagram of a signal processor of FIG. 3.

FIG. 7 shows details in the construction of each of the signal processors 72 of FIG. 3. In FIG. 7, the signal processor 72 comprises a switch 94 which may be fabricated as a MOS field-effect transistor (FET) switch, a source 96 of reference voltage, an amplifier 98 which includes a low-pass filter 100, a correlated double sampling circuit 102 and a hold circuit 104. The switch 94 is activated by a timing signal of the controller 74 on line 106. The signal processor 72 may comprise also a switch 108, a subtracter 110 and a drift control unit 112 for connecting the sampling circuit 102 to the hold circuit 104.

Figure 8:
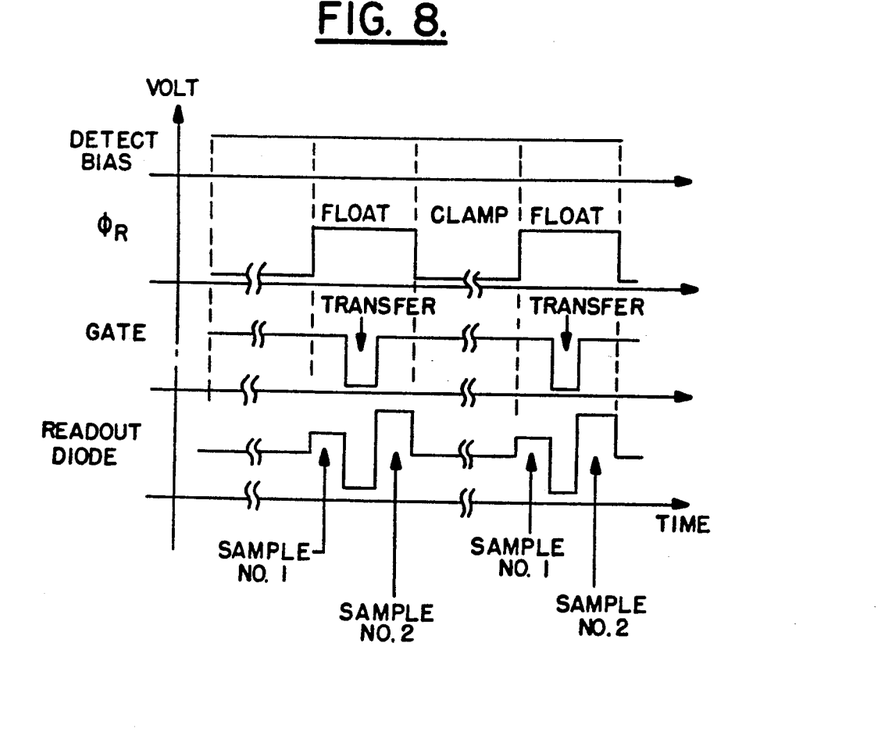
FIG. 8 is a timing diagram showing address and bias voltages employed in the operation of the detectors of FIGS. 1-3.

In operation, and with reference to FIGS. 3, 7 and 8, the voltage applied to the detectors 20 via the row conductors 60 is maintained throughout the charge integration interval and may also be maintained during the subsequent readout interval wherein data is read out from the detectors 20, and accumulated charge is extracted also from each of the detectors 20. This is shown in the graph of FIG. 8. With respect to the diodes 22, a bias voltage is applied to the diodes 22 via the column conductors 64 which are clamped to the bias voltage by the switch 94 during the charge integration interval. However, during the readout interval, the bias voltage is disconnected from the column conductors 64, the column conductors being allowed to float by operation of the switch 94 during the readout interval. With respect to the gates 24, the row conductors 56 are maintained at or substantially at ground potential during the charge integration interval; however, a bias voltage is applied to the gates 24 of successive ones of the rows via the row address lines 56 during the readout interval. The bias voltage applied to the diodes 22 during the charge integration interval facilitates removal of the charges stored in the respective detectors 20 during the subsequent readout interval. By virtue of the voltage applied to the diodes 22 during the integration interval, the diodes 22 are back-biased during the readout interval.

The foregoing voltage relationships are shown in the graph of FIG. 8 wherein the upper trace represents the constant bias voltage applied to a detector 20, the second trace represents the float-clamp status of the bias voltage applied to the column conductors 64, the third trace represents the pulse voltage waveform applied to a gate 24 to readout a charge, and the bottom waveform shows sampling of data from a diode 22.

In operation, the float-clamp status of the bias voltage supplied to a column conductor 64 is provided by the switch 94. The switch 94 is activated by the timing signal, identified as $\Phi_R$ in FIGS. 7 and 8, of the controller 74 on line 106 to connect the column conductor 64 via column address line 66 to the voltage source 96 for provision of the bias voltage to diodes 22 during the integration intervals of FIG. 8, and to disconnect the column conductor 66 from the voltage source 96 to allow the column conductor 66 to float during readout intervals of FIG. 8. The graph shows that the diode 22 is clamped to a reverse bias only during the charge integration intervals while, during the intervening readout intervals, the diode voltage is allowed to float, as shown in the second trace of FIG. 8. Also, the graph of FIG. 8 shows that an address voltage is applied to a gate, in the form of the transfer gate waveform of the third trace, only during the readout interval while, during intervening charge-integration intervals, the gate voltage is at or near ground potential. The readout interval serves a dual function of extracting image data for each of the pixels from the respective detectors 20, and also serves to reset the detectors 20 by extracting the accumulated charge via the gates and the diodes into the front-end circuitry of respective ones of the signal processors 72.

Also, if desired, during the implementation of row address signals via the row address lines 56, a gate 24 can be pulsed twice, or more, during one readout interval to insure a full transfer of charge from a detector 20. In addition, using a voltage pulse implementation, the voltage applied to the detector 20 may be reduced to near the flat band voltage to further assist with a transfer of charge from the detector 20 to the diode 22. This voltage reduction may be employed for only one row at a time.

The circuitry of the signal processor 72 may be constructed of CMOS circuitry. The amplifier 98 serves as a preamplifier, and has a high-impedance, low-leakage input for floating a column conductor 64 and for receiving charge from a detector 20 during a readout interval. During an integration interval, the voltage of the source 96 biases the amplifier 98 in its linear operating region. The low-pass filter 100 serves to remove high-frequency noise. The analog signal exiting the amplifier 98 is sampled by the sampling circuit 102 and stored in the hold circuit 104 for a sufficient amount of time to allow for extraction of the signal from the hold circuit 104 by the multiplexer 76 (FIG. 3). The line 106 from the controller 74 also carries timing signals for operation of the sampling circuit 102 and the hold circuit 104.

It is advantageous to construct the signal processor 72 with additional circuitry connected between the sampling circuits 102 and the hold circuit 104 for minimizing the effect of noise which may be present on a column conductor 66 during readout intervals, as well as for compensating for any drift, or droop, which may develop during use of the detector system. In operation, the signal outputted by the amplifier 98 is sampled twice, once at the beginning of a readout interval, and secondly at a later time in the readout interval after the transfer of charge from the detector 20 to the readout diode 22. The first sample is routed via the switch 108 to the negative input terminal of the subtracter 110 and the second sample is routed by the switch 110 to the positive input terminal of the subtracter 110. The first sample contains only noise resulting from the floating of the column conductor 66, while the second sample contains both signal plus the noise as shown in the bottom graph of FIG. 8. Subtraction of the first sample from the second sample by the subtracter 110, removes the noise. The drift correction unit 112 may comprise circuitry for recording typical changes in signals outputted by the subtracter 110 during readout. A change over time in the readout signal, as may occur due to effects of any incident photons upon the readout diodes 22 is readily noted, and may be compensated by subtracting the measured change from the signal prior to signal storage in the hold circuit 104.

With respect to the addressing of the array 28 (FIG. 3) to obtain data of specific pixels of the subject 26, during a readout interval, any one of the row address lines 56 can be activated to provide data of a complete row of pixels to the drive circuit 54. Thereupon, by operation of the multiplexers 76, all of the pixels of the selected row, or any one of a set of the pixels of the designated row may be selected by the multiplexer 76. Thereafter, a further row is selected. If desired, all of the rows may be selected sequentially for extraction of data from the entire array 28, or only a part of the array may be selected to provide for sub-framing of data. For example, if it is desired to obtain data concerning a single star from a multitude of stars being viewed by the array 28, then the controller 74 can be directed to extract data from only the portion of the array 28 which views the designated star. This provides a significant savings in the amount of time required to obtain data of the area of interest. This allows, if desired, a speeding up of the data gathering process wherein the reading intervals of FIG. 8 can be shortened to provide for a higher data rate in the extraction of imaging data from the subject 26. Also, the foregoing mode of operation allows for random accessing of the various pixels which is useful when two or more subject areas are of interest, so that one need not scan the entire array 28 to obtain the data of the areas of interest.

The arrangement of the detectors 20 in the array 28 provides for a more efficient use of the available area of the array 28 for viewing incident radiation. By assigning one diode 22 to two of the detectors 20, there is a savings of space in the array 28 which allows for an allocation of more area to the detection of incident radiation. Also, the reduction in the number of diodes 22 reduces the amount of capacitance presented to a column conductor 64. This achieves higher output voltage and allows for faster addressing and readout of pixel data. Also, there is electrical isolation between the detectors 20, the isolation being provided by physical spacing between the electrodes 46 of each of the detectors 20, as well as by virtue of the operation of the gates 24 and the diodes 22. This prevents both optical and electronic blooming. By using type-n material for fabrication of the detectors 20, the semiconductor surface in the field areas between adjacent pixels remains in accumulation. This provides excellent pixel-to-pixel isolation, even after total dose irradiation of the array 28. Each of the photodetectors is fully isolated from its readout diode when the transfer gate is off. This prevents blooming interference from charge integration in the photodetectors along a column during readout of any one pixel. Also, the shielding of a diode 22 by the shield 48 further inhibits blooming.

It is to be understood that the above described embodiments of the invention are illustrative only, and that modifications thereof may occur to those skilled in the art. Accordingly, this invention is not to be regarded as limited to the embodiments disclosed herein, but is to be limited only as defined by the appended claims.

What is claimed is:

1. A radiation detection system comprising:
   an array of radiation detectors constructed on a common substrate, said detectors producing electric charges in response to illumination by radiation incident upon said array from a subject;
   a set of readout diodes responsive to a column address signal, and a set of charge transfer gates responsive to a row address signal, said diodes and said gates being constructed on said common substrate;
   wherein, in the absence of said address signals, said diodes are disconnected electrically by said gates from said detectors allowing said detectors to develop said charges in response to the radiation; and
   in the presence of said address signals, potential wells form under said gates, said potential wells enabling said diodes to extract charge from individual ones of said detectors to provide image data of the subject.

2. A system according to claim 1 wherein each of said diodes is operative with a plurality of said gates for extracting charge from a plurality of said detectors.

3. A system according to claim 2 wherein said detectors are arranged in a plurality of rows in said array, said diodes are arranged in a plurality of rows with a single row of said diodes being located between a first detector row and a second detector row of two neighboring rows of said detectors, and said gates are arranged in a plurality of rows with a pair of gate rows being located on opposite sides of said single diode row to allow for transfer of charge from detectors of said first detector row and detectors of said second detector row to diodes of said single diode row.

4. A system according to claim 3 further comprising a controller for generating said address signals, and wherein the diodes of a plurality of said diode rows are arranged in columns, and said system further comprises column conductors connecting the diodes of respective ones of said diode columns in parallel for conducting electric signals from said diodes to said controller.

5. A system according to claim 4 wherein the gates of each of said rows of said gates are connected together, said system including a plurality of row address lines for connecting respective ones of said gate rows to said controller.

6. A system according to claim 5 wherein any one of said columns and any one of said rows are individually addressable to provide a random accessing of individual pixels of said array of radiation detectors.

7. A system according to claim 2 wherein each of said radiation detectors includes an electrode structure forming a window for receipt of incident visible and ultraviolet radiation.

8. A system according to claim 7 wherein said electrode structure comprises at least one of aluminum and chrome, and said window is configured as a central region of reduced thickness of said electrode structure.

9. A system according to claim 7 wherein said electrode structure is formed of polysilicon, and said window is configured as a set of spaced-apart fingers of said polysilicon.

10. A system according to claim 7 wherein said electrode structure is formed of polysilicon arranged around a border of said window, a central region of said window being free of the polysilicon.

11. A system according to claim wherein a front surface of said common substrate is configured as an epitaxial layer of varying thickness, said epitaxial layer including a thicker portion for support of electronic circuits coupled to said radiation detectors for reading out data from said radiation detectors, said epitaxial layer having a thinner portion for supporting said radiation detectors upon said substrate.

12. A system according to claim 1 wherein said radiation detectors are at least one of metal-oxide-semiconductor photodetectors and p-n diode photodetectors.

* * * * *